United States Patent [19]

Shibayama et al.

[11] 3,936,679

[45] Feb. 3, 1976

[54] ELASTIC SURFACE WAVE TRANSDUCER

[75] Inventors: Kimio Shibayama; Kazuhiko Yamanouchi, both of Sendai, Japan

[73] Assignee: Kimio Shibayama, Sendai, Japan

[22] Filed: Aug. 26, 1974

[21] Appl. No.: 500,697

[30] Foreign Application Priority Data

Aug. 31, 1973 Japan.................................. 48-97886

[52] U.S. Cl................................. 310/9.8; 333/30 R
[51] Int. Cl............................................. H01l 41/08
[58] Field of Search..................... 310/8.1, 9.7, 9.8; 333/30 R, 72

[56] References Cited
UNITED STATES PATENTS 3,742,396   6/1973   Bahr et al. ........................ 310/9.8 X
3,748,603   7/1973   Wojcik............................. 310/9.7 X
3,768,032   10/1973  Mitchell........................... 310/9.8 X

*Primary Examiner*—Mark O. Budd
*Attorney, Agent, or Firm*—Flynn & Frishauf

[57] ABSTRACT

An interdigital transducer used in an elastic surface wave device and including a pair of electrodes each having a common electrode and a plurality of electrode fingers connected to the common electrode, the overlap lengths of electrode fingers being uniform throughout the transducer. Floating electrodes, each having two parallel conductors connected together at one end, are disposed between the interdigital electrode fingers of the paired electrodes to weight the excitation electric field strength.

10 Claims, 15 Drawing Figures

ELASTIC SURFACE WAVE TRANSDUCER

This invention relates to an elastic surface wave transducer.

BACKGROUND OF THE INVENTION

An elastic surface wave device (also referred to as an acoustic surface wave device) used in the VHF band and UHF band as a filter or delay line already known to those skilled in the art. An elastic surface wave device has transmitting and receiving interdigital transducers disposed on a piezoelectric substrate. These transducers are used to convert electrical signals into elastic surface waves or vice versa.

A known transducer used in an elastic surface wave device is of the uniform overlap length interdigital type comprising first and second electrodes disposed on a substrate of piezoelectric material, each of the first and second electrodes having a common electrode connected to an external terminal and a plurality of electrode fingers connected to the common electrode, the overlap lengths of the electrode fingers of the first and second electrodes being uniform throughout the transducer.

However, the above-mentioned prior art uniform overlap length interdigital transducer has unsatisfactory frequency characteristics. Further, such transducer has a passband width bearing a substantially inverse proportion to the number of electrode fingers.

In Proc. IEEE, Vol. 59, No. 3, p.393, March (1971) is set forth a weighting transducer with a so-called "apodized electrode" arrangement for improving the frequency response of the transducer. With this apodized type weighting transducer, the overlap lengths of the electrode fingers are made to vary in proportion to a weighting function, causing the widths of excited elastic surface wave beams to be weighted in proportion to the weighting function. Though a weighting function with respect to the frequency transmitting property of an ideal filter is sin $x/x$, a practically used function is, for example $$\frac{\sin x}{x} \cdot \frac{\pi^2}{\pi^2 + x^2}$$

approximating the function sin $x$ /$x$.

When the apodized transducers are used as input and output transducers, it is impossible to obtain the product property of the transfer functions of both transducers. For a prominent guaranteed attenuation in the stop band, however, the product property should be attained. Following is the reason why apodised type weighting transducers used as input and output transducers can not provide a desired product of transfer functions. The electrode fingers of the output transducer overlapping each other over a small length can not fully pick up an elastic surface wave having a larger beam width from the input transducer, failing to produce an output signal proportional to the weight of the beam width.

To obtain, therefore, the product of transfer functions, an apodized type weighting transducer is combined with a uniform overlap length type transducer. In this case, the electrodes of the apodized type weighting transducer should be made more precisely than in the case with two weighting transducers in order to attain a prominent guaranteed attenuation in the stop band. However, this is difficult to realize.

It is accordingly an object of this invention to provide a weighting transducer, which, combined with any other type of transducer, can easily realize the product property of the transfer functions of both transducers.

Another object of the invention is to provide a uniform overlap length interdigital transducer with an improved frequency response.

SUMMARY OF THE INVENTION

A uniform overlap length type interdigital weighting transducer of this invention is characterized in that a plurality of floating electrodes each having a pair of parallel conductors connected together at one end are disposed on a piezoelectric substrate between the adjacent interdigital electrode fingers of the first and second electrodes. The parallel conductors preferably extend along the entire overlap length of the interdigital electrode fingers of the first and second electrodes. A plurality of the above-mentioned floating electrodes arranged between pairs of interdigital electrode fingers in numbers progressively increasing from the center of the transducer to both ends thereof along the propagation axis of the elastic surface wave can weight the strength of an excitation electric field in proportion to a weighting function.

When combined with any other type of transducer, the weighting transducer of this invention which has the electrode fingers overlapped by each other in the uniform length throughout the transducer, can easily realize the product property of the transfer functions of both transducers.

Further, the rejection of the side lobe of the weighting transducer of this invention can be easily improved to a larger extent than 10 dB as compared with the ordinary uniform overlap length type transducer.

DETAILED DESCRIPTION OF THE INVENTION

Figure 1:
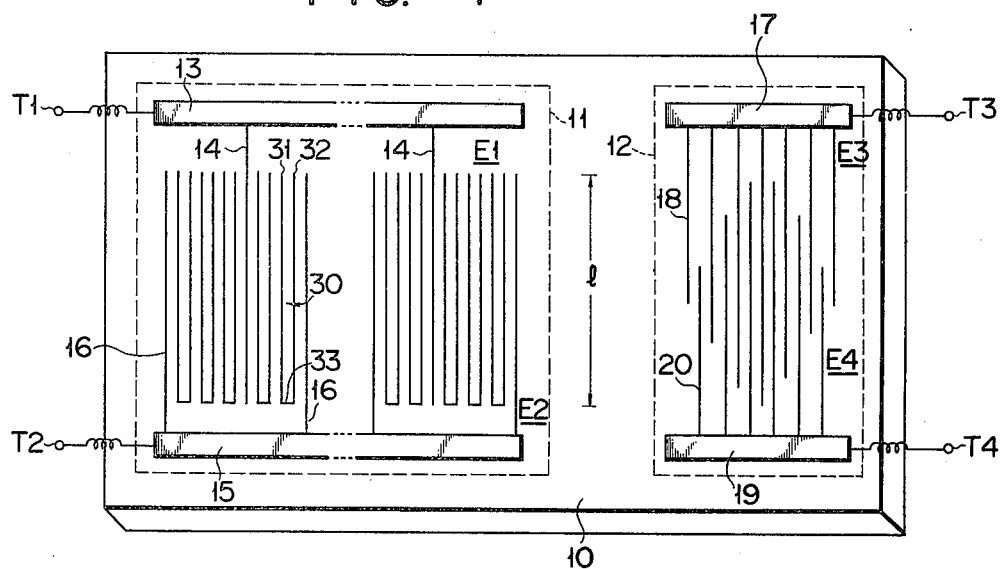
FIG. 1 schematically illustrates an elastic surface wave device using the weighting transducer of this invention.

As shown in FIG. 1, an input transducer 11 and an output transducer 12 are provided on a substrate 10 made of piezoelectric material such as quartz crystal, lithium niobate, lithium tantalate and the like. In this case, the input transducer 11, includes the weighting transducer of this invention and the output transducer 12 is formed of the known apodized type weighting transducer.

Figure 2:
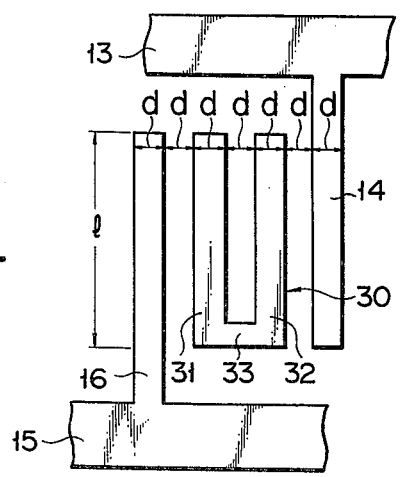
FIG. 2 shows the position of a floating electrode relative to the interdigital electrode fingers.

The input transducer 11 comprises first and second electrodes E1, E2 formed on the substrate 10 and made of conductive material such as aluminium or gold. The first electrode E1 includes a common electrode 13 connected to an external terminal T1 and electrode fingers 14 connected to the common electrode 13. The second electrode E2 includes a common electrode 15 connected to an external terminal T2 and electrode fingers 16 connected to the common electrode 15. The electrode fingers 14 of the first electrode E1 are interdigated by the fingers 16 of the second electrode E2. The interdigital electrode fingers 14, 16 in the input transducer 11 are made to have a uniform overlap length $l$ throughout the transducer. Further, according to this invention, on the substrate 10 is disposed between the electrode finger 14 of the first electrode E1 and the adjacent electrode finger 16 of the second electrode E2 at least one floating electrode 30 which is not connected to either of the first and second electrodes E1, E2 and comprises a pair of parallel conductors 31, 32 and a connection conductor 33 connecting the parallel conductors 31, 32 at one end. The paired parallel conductors 31, 32 are arranged to have a length equal to the overlap length $l$ and extend, as shown in FIG. 2, along the entire overlap length $l$ of the interdigital electrode fingers 14, 16.

The electrode fingers 14, 16 of the first and second electrodes E1, E2 and the parallel conductors 31, 32 of the floating electrode 30 have the same width $d$. A space between the floating electrode 30 and an adjacent electrode finger, a space between said parallel conductors 31, 32 and a space between the adjacent floating electrodes 30 may be chosen to be $d$, though the spacing need not be $d$. The practical dimensions of $l$ and $d$ are about 5 mm and 25 $\mu$m, respectively.

The apodized type output transducer 12 comprises first and second electrodes E3, E4. The first electrode E3 includes a common electrode 17 connected to an external terminal T3 and electrode fingers 18 connected to the common electrode 17. The second electrode E4 includes a common electrode 19 connected to an external terminal T4 and electrode fingers 20 connected to an external terminal T4 and electrode fingers 20 connected to the common electrode 19. In the apodized type output weighting transducer 12, the overlap lengths of interdigital electrode fingers 18, 20 progressively decrease from the center to both ends of the transducer in proportion to a weighting function $$\frac{\sin x}{x} \cdot \frac{\pi^2}{\pi^2 + x^2}.$$

Figure 3A:
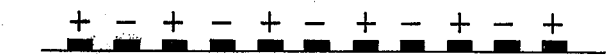
FIGS. 3A, 4A, 5A and 6A represent the arrangement of the floating electrodes and interdigital electrodes.
Figure 3B:
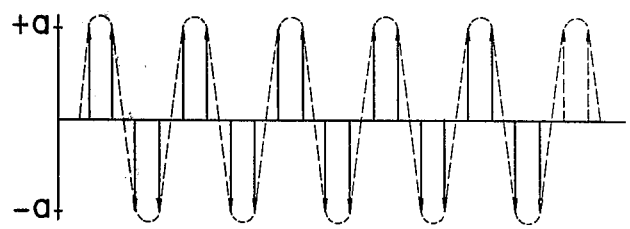
FIGS. 3B, 4B, 5B and 6B indicate distributions of stresses corresponding to the electrode arrangements of FIGS. 3A, 4A, 5A and 6A.

The width of the electrode fingers 18, 20 and a space between the adjacent electrode fingers 18, 20 may be chosen to be the same as in the input transducer 11.

Where the uniform overlap length type weighting transducer of this invention is combined with an apodized type weighting transducer, then it is desired that the maximum overlap length of the interdigital electrode fingers of the apodized type weighting transducer be equal to the uniform overlap length $l$ of the interdigital electrode fingers in the uniform overlap length interdigital transducer.

Where the weighting transducer of this invention which is a combination of the ordinary uniform overlap length type transducer and the floating electrode has the same magnitude of voltage impressed across the respective electrode fingers, then the strength of an excitation electric field is more reduced due to the presence of the floating electrode than in a transducer without the floating electrode. Therefore, a plurality of floating electrodes arranged along the propagation axis of an elastic surface wave can weight the strength of an excitation electric field in proportion to a weighting function. FIG. 3A represents the arrangement of electrodes in the ordinary uniform overlap length type transducer. FIG. 3B shows a distribution of stresses generated at the edges of the respective electrodes of FIG. 3A by the indicated arrows. The length a of each arrow denotes the magnitude of the stress generated. Where the impulse train of the stress is expanded into Fourier series, then the coefficient of a fundamental wave component which has a period represented by the dotted curve of FIG. 3B becomes 2 $\sqrt{2}a$. This component excites an elastic surface wave having the fundamental period.

Figure 4A:
Figure 4B:
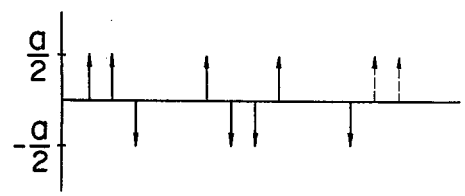
Figure 5A:
Figure 5B:
Figure 6A:
Figure 6B:
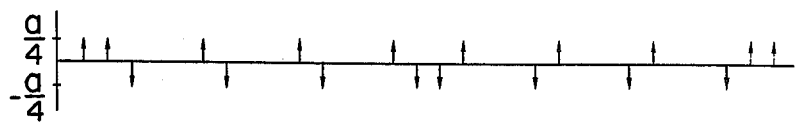

FIG. 4A indicates an arrangement in which a pair of parallel conductors of a floating electrode are disposed between the adjacent electrode fingers of uniform overlap length interdigital electrodes. In this case, the magnitudes of stresses are distributed as shown in FIG. 4B. Where the impulse train of the stresses is expanded into Fourier series, then the coefficient of the fundamental component becomes ⅓ × 2 $\sqrt{2}a$. Thus it will be seen that the electrodes of FIG. 4A have the excitation power reduced to one-third as compared with that of the electrodes of FIG. 3A. Where two pairs of parallel conductors are provided between the adjacent interdigital electrode fingers as shown in FIG. 5A, then the magnitudes of stresses generated are distributed as indicated in FIG. 5B. In this case, the coefficient of the fundamental wave component is 1/5 × 2 $\sqrt{2}a$ as compared with that of the fundamental wave component of FIG. 3A. Where, as shown in FIG. 6A, three pairs of parallel conductors are positioned between the adjacent interdigital electrode fingers, then the magnitudes of stresses are distributed as shown in FIG. 6B. The coefficient of the fundamental wave component is 1/7 × 2 $\sqrt{2}a$.

As will be evident from the foregoing, where i pairs of parallel conductors are provided between the adjacent interdigital electrode fingers, then the coefficient of the fundamental wave component becomes $$\frac{1}{2i+1} \times 2 \sqrt{2}a.$$

In this case, the excitation power is equal to $$\frac{1}{2i+1}$$

of that of the basic arrangement of electrodes shown in FIG. 3A.

Figure 7:
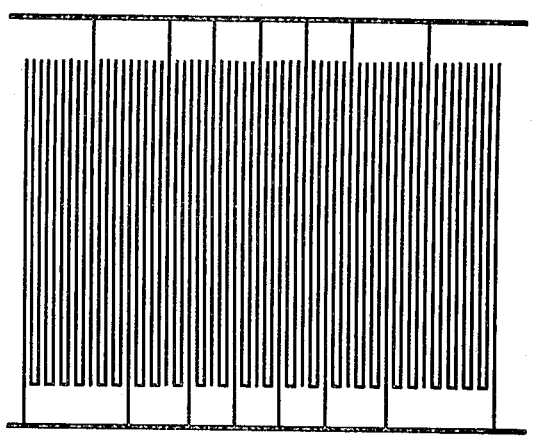
FIG. 7 shows an example of the arrangement of floating electrodes in the weighting transducer of the invention.
Figure 8:
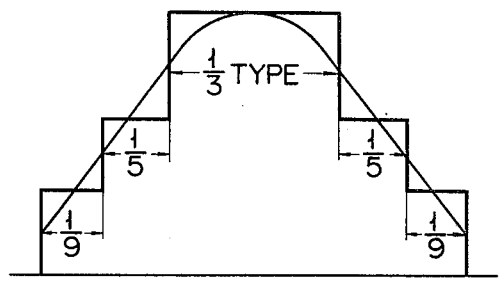
FIG. 8 shows the distribution of the strength of an excitation electric field derived from the floating electrodes arranged as indicated in FIG. 7.

As seen from the foregoing description, it is possible to weight the strength of an excitation electric field or an elastic surface wave by arranging the floating electrodes appropriately along the propagation axis of elastic surface wave. FIG. 7 illustrates an example of the arrangement of the weighting transducer of this invention. Where floating electrodes are provided in numbers progressively increasing from the center to both ends of the transducer, then the strength of an excitation electric field indicates, as shown in FIG. 8, a stepwise distribution substantially proportional to a weighting function. In this case, it is not always necessary, as easily understood, to provide any floating electrode in the central part of the transducer. What is important is that the floating electrodes should be arranged in numbers progressively increasing from the center to both ends of the transducer. It is noted, however, that the arrangement of floating electrodes need not necessarily follow such a distribution as mentioned above.

There will now be described the operation of the elastic surface wave device of FIG. 1 comprising an input transducer utilizing the uniform overlap length type weighting transducer 11 of this invention and an output transducer 13 formed of the known apodized type weighting transducer. Elastic surface waves generated by the input transducer 11 have their strength weighted along the propagation axis. However, the strength of an elastic surface wave remains constant throughout the beam width or the overlap length $l$. Where, therefore, an elastic surface wave from the input transducer 11 having a constant beam width and strength is supplied to the output transducer 12 having some of the electrode fingers overlapped by each other in a smaller length and the others overlapped by each other in a larger length, then the output transducer 12 generates outputs having amplitudes proportional to the smaller and larger overlap lengths of the electrode fingers thereof, each time the above-mentioned surface wave from the input transducer 11 passes through the sections of the different overlap lengths. Namely, impulse-response wave forms at the electrode sections of a smaller overlap length and those of a larger overlap length bear a relationship of precise similarity. Therefore, an overall transfer function between the input and output transducers 11, 12 can be expressed as a product of the transfer functions of the respective transducers.

It is possible to use two floating electrode type weighting transducers of this invention, as input and output transducers respectively. Further, the weighting transducer of the invention may be combined not only with the apodized type weight transducer but also with any other type, such as a uniform overlap length type transducer or normalized transducer. In this case, the present floating electrode type weighting transducer may be used either as an input or as an output transducer.

Figure 9:
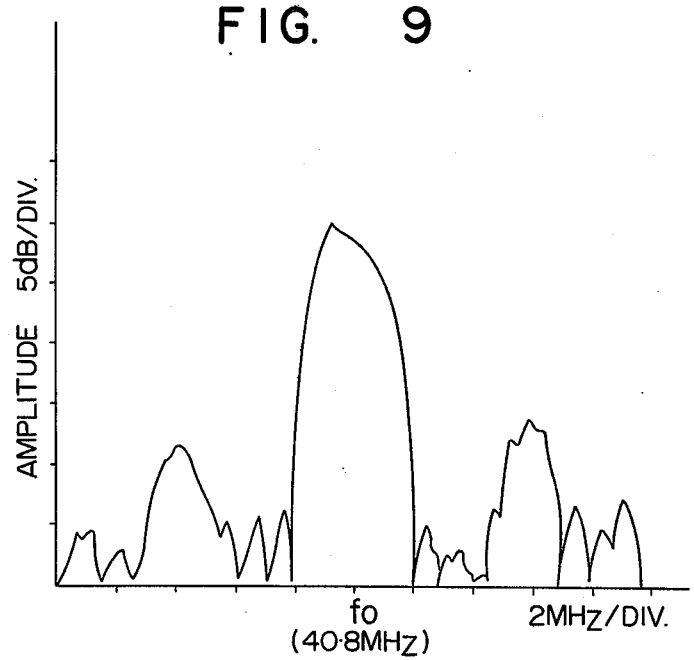
FIGS. 9 to 11 represent the results of experiments with the weighting transducer of the invention.

FIG. 9 illustrates the frequency characteristics of the floating electrode type weighting transducer of this invention detected by a uniform overlap length type transducer comprised of a smaller number of electrode fingers and capable of presenting fully broad band characteristics, where both transducers are disposed on a substrate formed of 131° rotated Y-cut X-propagating LiNbO$_3$ crystal.

Figure 10:
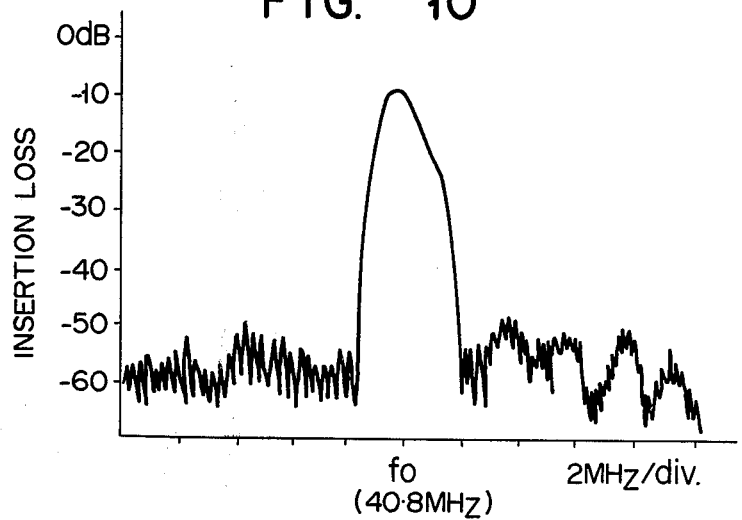

FIG. 10 indicates the overall frequency characteristics of two floating electrode type weighting transducers of this invention used as input and output transducers respectively. Comparison between FIGS. 9 and 10 shows that in the case of FIG. 10, the product property of the transfer functions of the input and output transducers is obtained.

Figure 11:
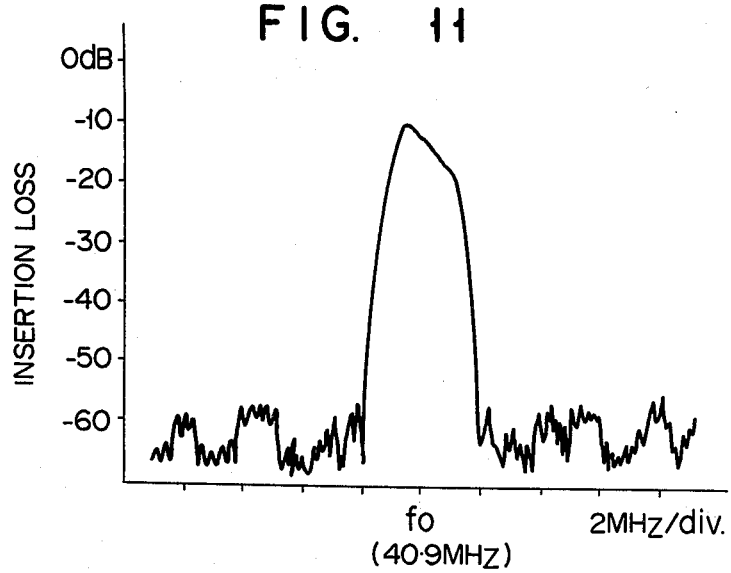

FIG. 11 shows the overall frequency characteristics of the floating electrode type weighting transducer used as an input transducer and the apodized type weighting transducer used as an output transducer. In this case, the generated attenuation amounted to about 45 dB, a value fully available for practical application.

What we claim is:

1. An elastic surface wave interdigital transducer comprising:
   a piezoelectric substrate;
   first and second electrodes disposed on said piezoelectric substrate, each of said first and second electrodes having a common electrode connected to an external terminal and a plurality of electrode fingers connected to said common electrode, the electrode fingers of said first electrode overlapping with and being interdigitated by the electrode fingers of said second electrode, the overlap lengths of the interdigital electrode fingers of said first and second electrodes being substantially uniform throughout the transducer; and
   a plurality of floating electrodes, each floating electrode including a pair of parallel conductors connected together at one end, said floating electrodes being disposed on said piezoelectric substrate between said interdigital electrode fingers of said first and second electrodes, the number of said floating electrodes located between respective pairs of said interdigital electrode fingers progressively increasing from the center of said transducer to both ends of said transducer.

2. An elastic surface wave transducer according to claim 1, wherein said paired parallel conductors of said floating electrodes extend along the entire overlap length of the interdigital electrode fingers of said first and second electrodes.

3. An elastic surface wave transducer according to claim 1, wherein said paired parallel conductors of said floating electrodes have a length substantially equal to the overlap length of the interdigital electrode fingers of said first and second electrodes.

4. An elastic surface wave transducer according to claim 1, wherein said paired parallel conductors of said floating electrodes have substantially the same width as the electrode fingers of said first and second electrodes.

5. An elastic surface wave interdigital transducer comprising:
   a substrate made of piezoelectric material;
   first and second electrodes disposed on said piezoelectric substrate, and each having a common electrode connected to an external terminal and a plurality of electrode fingers connected to said common electrode, the electrode fingers of said first electrode being interdigitated by the electrode fingers of said second electrode; and
   a plurality of floating electrodes, each floating electrode including a pair of parallel conductors connected together at one end, said floating electrodes being disposed on said piezoelectric substrate between the interdigital electrode fingers of said first and second electrodes, said floating electrodes being arranged between respective pairs of said interdigital electrode fingers in numbers progressively increasing from the center to both ends of said transducer.

6. An elastic surface wave transducer according to claim 5, wherein said paired parallel conductors of said floating electrodes have substantially the same width as the electrode fingers of said first and second electrodes.

7. An elastic surface wave device comprising:

a substrate made of piezoelectric material;

a first interdigital transducer including: first and second electrodes disposed on said piezoelectric substrate, each of said first and second electrodes having a common electrode connected to an external terminal and a plurality of electrode fingers connected to said common electrode, the electrode fingers of said first electrode overlapping with and being interdigitated by the electrode fingers of said second electrode, the overlap lengths of the interdigital electrode fingers of said first and second electrodes being substantially uniform throughout said first transducer; and a plurality of floating electrodes respectively including a pair of parallel conductors connected together at one end and disposed on said piezoelectric substrate between the interdigital electrode fingers of said first and second electrodes, the number of said floating electrodes located between respective pairs of said interdigital electrode fingers progressively increasing from the center of said first transducer to both ends of said first transducer; and a second interdigital transducer disposed on said piezoelectric substrate and including third and fourth electrodes each having a common electrode connected to an external terminal and electrode fingers connected to said common electrode, the electrode fingers of said third electrode overlapping with and being interdigitated by the electrode fingers of said fourth electrode, the overlap lengths of interdigital electrode fingers of said third and fourth electrodes progressively decreasing from the center of said second transducer to both ends of said second transducer.

8. An elastic surface wave transducer according to claim 7 wherein said paired parallel conductors of said floating electrodes of said first transducer extend along the entire overlap length of the interdigital electrode fingers of said first and second electrodes of said first transducer.

9. An elastic surface wave transducer according to claim 7, wherein said paired parallel conductors of said floating electrodes of said first transducer have a length substantially equal to the overlap length of the interdigital electrode fingers of said first and second electrodes of said first transducer.

10. An elastic surface wave transducer according to claim 7, wherein said paired parallel conductors of said floating electrodes of said first transducer have substantially the same width as the electrode fingers of said first and second electrodes of said first transducer.

* * * * *